(12) United States Patent
Gilet et al.

(10) Patent No.: US 11,749,456 B2
(45) Date of Patent: Sep. 5, 2023

(54) CAPACITIVE BLOCK COMPRISING A FRAME OF ELECTRICALLY INSULATING MATERIAL

(71) Applicant: Valeo Siemens eAutomotive France SAS, Cergy (FR)

(72) Inventors: Olivier Gilet, Cergy (FR); Anthony Lamarche, Cergy (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 51 days.

(21) Appl. No.: 17/601,302

(22) PCT Filed: Apr. 3, 2020

(86) PCT No.: PCT/EP2020/059642
§ 371 (c)(1),
(2) Date: Oct. 4, 2021

(87) PCT Pub. No.: WO2020/201543
PCT Pub. Date: Oct. 8, 2020

(65) Prior Publication Data
US 2022/0216006 A1    Jul. 7, 2022

(30) Foreign Application Priority Data
Apr. 5, 2019 (FR) .................... 1903711

(51) Int. Cl.
*H01G 2/10* (2006.01)
*H01G 2/04* (2006.01)
*H01G 4/228* (2006.01)

(52) U.S. Cl.
CPC .............. *H01G 2/106* (2013.01); *H01G 2/04* (2013.01); *H01G 2/103* (2013.01); *H01G 4/228* (2013.01)

(58) Field of Classification Search
CPC .......... H01G 4/38; H01G 4/228; H01G 4/224; H01G 2/10; H01G 2/04; H01G 11/82; H01G 11/08; H05K 7/1432; B60L 50/40
See application file for complete search history.

(56) References Cited

U.S. PATENT DOCUMENTS

| 4,683,516 A * | 7/1987 | Miller .................. H01G 9/08 361/328 |
| 2002/0051335 A1 | 5/2002 | Ohya et al. |

(Continued)

FOREIGN PATENT DOCUMENTS

| EP | 2562811 A1 | 2/2013 |
| WO | 2013/113691 A1 | 8/2013 |
| WO | 2015/128571 A1 | 9/2015 |

OTHER PUBLICATIONS

International Search Report and Written Opinion issued in corresponding International Patent Application No. PCT/EP2020/059642, dated Jun. 26, 2020 (12 pages).

*Primary Examiner* — Eric W Thomas
(74) *Attorney, Agent, or Firm* — Osha Bergman Watanabe & Burton LLP (57) ABSTRACT

A capacitive block includes at least one capacitive element, a first electrical conductor that includes at least one electrically conductive plate abutting a first end of the at least one capacitive element so as to be electrically connected to the at least one capacitive element, and a first frame made of electrically insulating material coming into register with a peripheral edge of the at least one electrically conductive plate so as to electrically insulate the at least one electrically conductive plate from an environment of the capacitive block.

10 Claims, 5 Drawing Sheets

(56) References Cited

U.S. PATENT DOCUMENTS

2010/0134974 A1\* 6/2010 Nguyen ............... B60L 50/40
361/689
2014/0168901 A1 6/2014 Ide et al.
2018/0233285 A1 8/2018 Sato et al.

\* cited by examiner

CAPACITIVE BLOCK COMPRISING A FRAME OF ELECTRICALLY INSULATING MATERIAL

The present invention relates to a capacitive block, notably for an electrical apparatus, for example installed in a motor vehicle, notably an electric or hybrid motor vehicle. Such an electrical apparatus may be an inverter, a voltage converter or an electrical battery charger.

As is known, in a capacitive block, a capacitive element may be arranged in a casing and embedded in a filler material mainly performing the function of supporting the capacitive element and protecting it from moisture. Such a filler material generally takes the form of a resin. The capacitive element is for example composed of films that are wound around the terminals of the capacitor. Typically, the capacitive element is fully embedded in the resin such that the outside of the capacitive block is formed by outer walls of the casing and a face that is formed by the resin. Only electrical terminals extend out of the resin from said face. However, in certain applications, in particular in electric or hybrid vehicles, it is sought to decrease the bulk of the electronic components. Now, in this capacitive block structure, the casing and the resin take up an amount of space that may be not insignificant. Furthermore, it is necessary to leave a space between the capacitive element and the lateral walls of the casing in order to allow the resin to flow before it sets.

A capacitive block is known in which the casing extends over a height shorter than the height of the capacitive element. The casing then forms a basin which is just large enough to receive resin at a first end of the capacitive block that comprises the electrical connection between an electrical terminal of the capacitive block and an electrode of the capacitive element.

In such a structure, the bulk of the capacitive block is limited because of the short height of the casing. However, in such a capacitive block structure, the portion of the capacitive element that is outside the resin is not protected against an outside environment of the capacitive block. Notably, when an electrically conductive plate is attached to a second end of the capacitive element, said second end being opposite the first end, the electrical plate is not a priori insulated from an immediate environment.

There is therefore a need to electrically protect the elements of a capacitive block that are not otherwise protected by a resin.

To this end, the invention relates to a capacitive block comprising:
at least one capacitive element;
a first electrical conductor comprising at least one electrically conductive plate abutting a first end of the capacitive element so as to be electrically connected to the capacitive element; and
a first frame made of electrically insulating material coming into register with a peripheral edge of said conductive plate so as to electrically insulate said plate from an environment of the capacitive block.

By abutting the edges of the conductive plate, the first frame prevents an electric current from flowing between an electrically conductive element close to the capacitive block, through the air and/or along a leakage path.

According to one embodiment, said first frame comprises a first portion configured to abut a face of the electrically conductive plate and a second portion extending transversely from said first portion so as to form a skirt around said conductive plate. Thus, the skirt forms an electrically insulating barrier with respect to elements located in the vicinity of the conductive plate. Notably, the skirt faces the edges of said conductive plate. In particular, the face that the first portion abuts is opposite the first end of the capacitive element.

According to one variant, said skirt stops at a height less than half, or even a third or a quarter of the height of the capacitive element from the first end. Thus, the skirt does not extend over the whole height of the capacitive element, thereby limiting the bulk of the capacitive block.

According to one variant, the skirt extends over a distance from the first portion of the first frame so as to prevent an electric current from flowing through the air between the conductive plate and an environment of the capacitive block.

According to one embodiment, said first electrical conductor includes at least one connecting portion extending from a peripheral edge of said conductive plate in a transverse direction with respect to said conductive plate, and said first frame comprises a protective portion extending facing a face of said connecting portion so as to protect it electrically from an environment of the capacitive block. In particular, said protective portion extends parallel to said face of said connecting portion.

According to one variant, the first electrical conductor comprises a first connecting portion that extends away from the capacitive element, and said first frame comprises a first protective portion that extends from the first portion of the first frame in a direction opposite to that of the skirt formed by the second portion of the frame.

According to one variant, the first electrical conductor comprises a second connecting portion that extends from the conductive plate facing the capacitive element, and said first frame comprises a second protective portion formed by at least part of the skirt.

According to one embodiment, said first frame supports at least one second electrical conductor configured to go over the first electrical connector so as to connect the first electrical conductor to an electrical component other than the capacitive element, notably to a filtering element for filtering an electrical power supply. Thus, the second electrical conductor is integrated into the first frame. The first frame therefore has the function of electrically insulating the conductive plate, but also, by virtue of the second electrical conductor, the function of electrically connecting the first conductor and a different element of the capacitive block.

According to one particular variant, one end of one connecting portion, notably of the second connecting portion, is configured to go over one end of the second electrical conductor of the first frame in order to make an electrical connection.

According to one embodiment, the capacitive block further comprises an electrically insulating film in the form of a frame, running continuously all along the inner edge of the first frame and extending radially toward the inside of the first frame. The insulating film notably makes it possible to enlarge the leakage path between the conductive plate and an element in the vicinity of the capacitive block, notably an element located facing the conductive plate.

According to one embodiment, the conductive plate abuts at least one electrode of the capacitive element, said electrode being located at said first end of the capacitive element, in order to be connected thereto. In particular, the connection between the conductive plate and the electrode of the capacitive element is protected by a varnish.

The invention further relates to an electrical apparatus, notably configured to be installed in a vehicle, comprising a capacitive block according to the invention, a power electronic module and a cooling circuit. The conductive plate of the capacitive block abuts one face of the cooling circuit; and the power electronic module abuts an opposite face of the cooling circuit.

In particular, the power electronic module is an assembly comprising a plurality of semiconductor chips forming an electrical circuit, said chips being encapsulated in one and the same package. More specifically, the power electronic module may form an inverter and comprises components through which power supplying an electric machine flows, for example an electric motor configured to drive a vehicle. Said components are then intended to transform a direct current into alternating currents or vice versa. Such a power electronic module is notably configured to allow electrical power to flow in a controlled fashion between a high-voltage power supply battery and the electric machine.

According to one embodiment, the electrical apparatus comprises a capacitive block comprising the first connecting portion and the first protective portion. The first connecting portion is connected directly to the electrical terminals of the power electronic module, passing through a passage formed at least in part by an edge of the cooling circuit. Also, the first protective portion of said first frame extends in said passage between said first connecting portion and said cooling circuit. Thus, the first protective portion of the first frame electrically insulates the first connecting portion of the first electrical conductor from the cooling circuit. The first connecting portion notably prevents an electric arc from forming in the air between the first connecting portion and the cooling circuit.

According to one embodiment, the electrical apparatus comprises a layer of electrically insulating but thermally conductive material between the cooling circuit and the conductive plate, said layer of material going into the central opening of the first frame. This material enhances the electrical insulation of the conductive plate, by insulating it from elements of the environment that are located facing the outer face of the conductive plate. In particular, this material electrically insulates the conductive plate from the cooling circuit. However, this material contributes to the heat exchange between the conductive plate and the cooling circuit.

According to one embodiment, the electrical apparatus forms an inverter, or a voltage converter or an electrical battery charger.

The invention will be better understood and other details, features and advantages of the invention will become apparent from reading the following description, given by way of non-limiting example with reference to the appended figures, in which:

It should be noted that the figures disclose an example according to the invention in a detailed manner in order to implement it, said figures of course being able to serve to better define the invention where appropriate.

Figure 1:
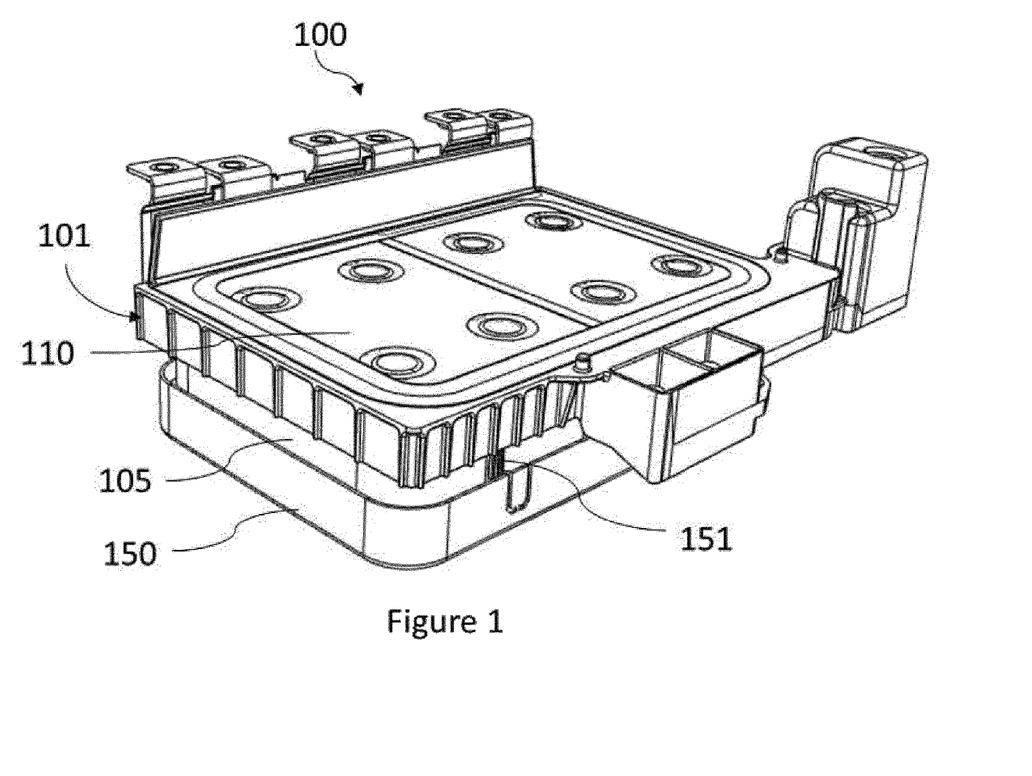
FIG. 1 shows an example of a capacitive block according to one embodiment of the invention.
Figure 2:
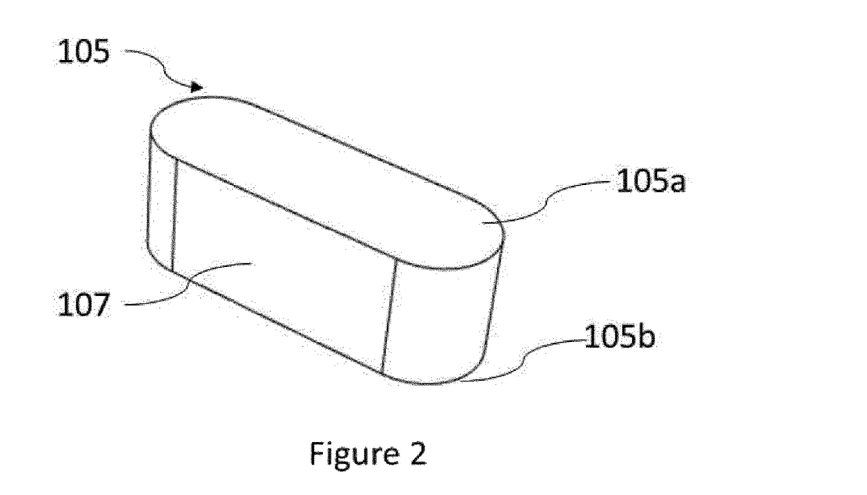
FIG. 2 shows a capacitive element of the capacitive block of FIG. 1.

FIG. 1 depicts a capacitive block 100 according to one example of the invention. The capacitive block 100 comprises capacitive elements 105. Such a capacitive element 105 is illustrated in FIG. 2. The capacitive element 105 notably comprises an electrode formed at a first end 105*a* of the capacitive element 105. The electrode may extend over the whole first end 105*a*. The capacitive element 105 notably comprises a body 107 that protects the capacitive element 105. In particular, the body 107 may be electrically insulating. A second end 105*b* opposite the first end 105*a* comprises an electrode of opposite polarity to the electrode of the first end 105*a*. The electrode may extend over the whole second end 105*b*. Alternatively, the capacitive element 105 might have its electrodes grouped together on a single end 105*a*, 105*b*. The capacitive element 105 is for example a film capacitor. The capacitive block 100 might comprise only a single capacitive element 105.

The capacitive block 100 further comprises a first electrical conductor 110 including an electrically conductive plate 112 that abuts the first end 105*a* of the capacitive element 105 in order to be electrically connected thereto. Notably, the conductive plate 112 abuts the electrode of the first end 105*a* in order to be connected thereto. To this end the plate 112 may comprise tabs 112L, which may be seen more clearly in FIG. 3, which are defined in the plate 112 in order to be welded onto the first end 105*a*. A lacquer, notably a silicone lacquer, may be applied at the connection between the tabs 112L and the first end 105*a*, but also over the entire area of the first end 105*a*, for protection from moisture. However, when the first end 105*a* is devoid of electrodes, the conductive plate may abut the first end 105*a* in order to ground the body 107 of the capacitive element 105.

Figure 7:
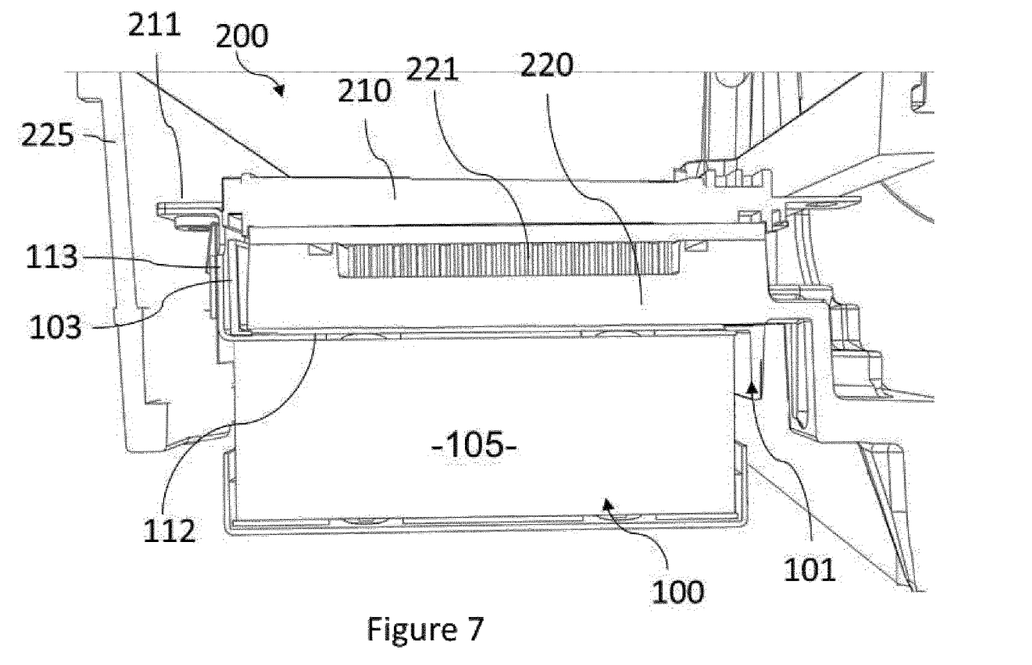
FIG. 7 shows an example of an electrical apparatus according to one embodiment of the invention.

The capacitive block 100 also comprises a first frame 101 made of electrically insulating material, for example of plastic. The frame 101 comes into register with a peripheral edge of the conductive plate 112 so as to electrically insulate the plate 112 from an environment of the capacitive block 100. For example, as illustrated in FIG. 7 (described below), when the capacitive block 100 is integrated into an electrical apparatus 200, the frame 101 makes it possible to electrically insulate the conductive plate 112 from a cooling circuit 220 that is in the vicinity of the capacitive block 100.

Figure 4:
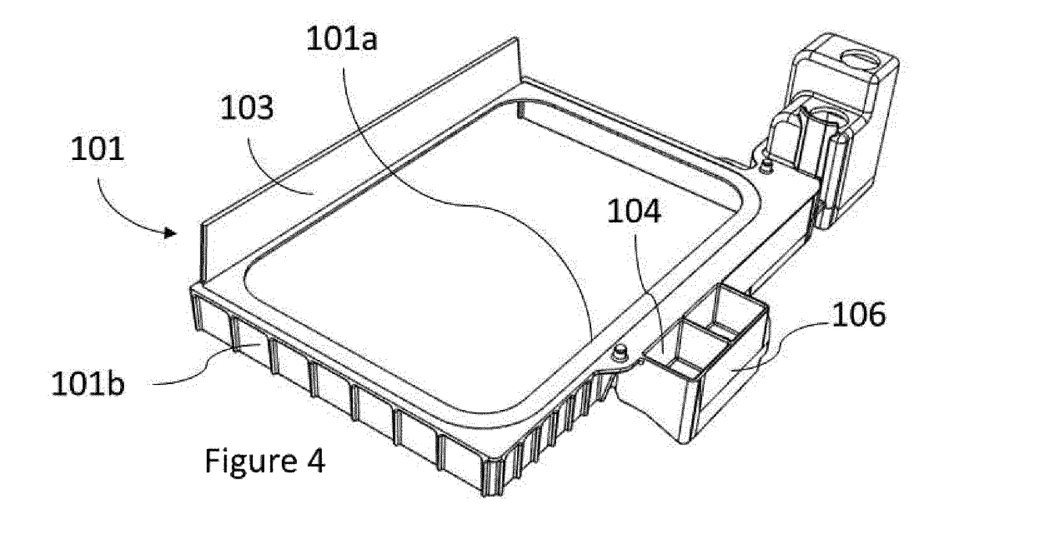
FIG. 4 shows the frame of the capacitive block of FIG. 1.

FIG. 4 shows the frame 101 of the capacitive block 100. The frame 101 therefore comprises a central opening delimited by an inner edge. The frame 101 notably comprises a first portion 101*a* configured to abut a face of the electrically conductive plate 112. The first portion 101*a* in particular abuts the face of the conductive plate 112 that is opposite the capacitive element 105. In particular, the first portion 101*a* comprises the inner edge of the frame 101.

The frame 101 may further comprise a second portion 101*b* that extends transversely from the first portion 101*a* so as to form a skirt 101*b* around the conductive plate 112. The skirt 101*b* contributes to electrically insulating the conductive plate 112 from its environment. Notably, the skirt 101*b* faces the edges of the conductive plate 112, and goes beyond the edges of the conductive plate 112 toward the second end 105*b* of the capacitive element 105. However, the skirt 101*b* does not reach the second end 105*b* of the capacitive element 105. Thus, the bulk of the capacitive block 100, notably in a direction perpendicular to the skirt 101*b*, is limited. In the figures, the height of the skirt 101*b*, that is to say the distance between the edge of the skirt 101*b* that is linked to the first portion 101a and the furthest edge of the skirt 101b, is less than half the height of the capacitive element 105. The height of the capacitive element 105 is notably the distance between the first end 105a and the second end 105b.

Figure 3:
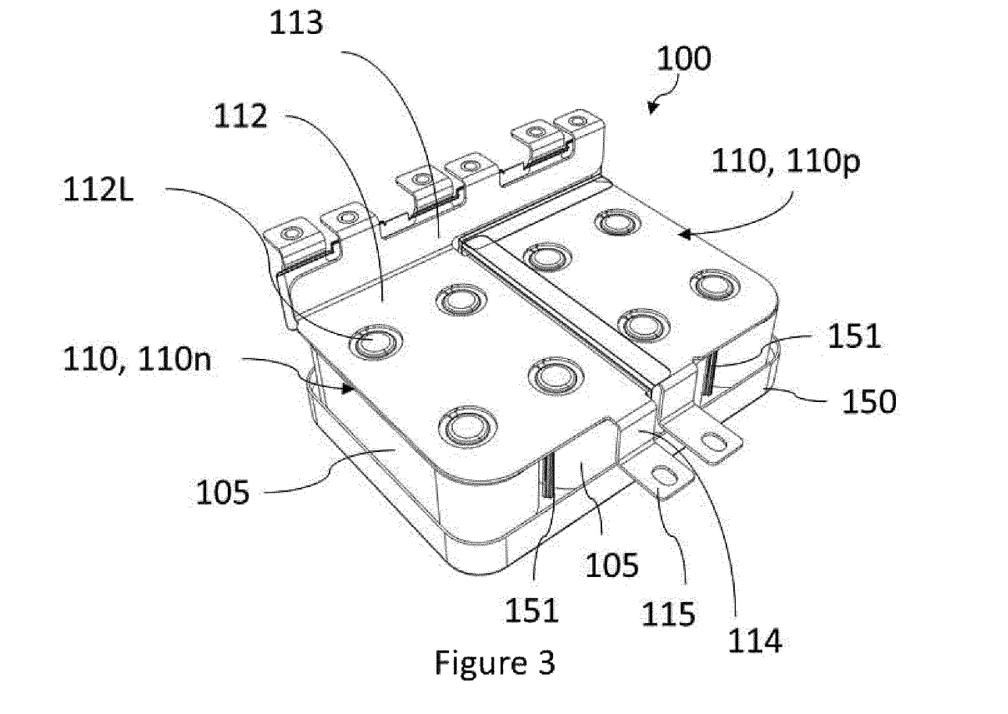
FIG. 3 shows the capacitive block of FIG. 1 without the frame.

As illustrated for example in FIG. 3, the capacitive block 100 may comprise electrical terminals formed by connecting portions 113, 114 of the first conductor 110. The connecting portions 113, 114 extend from a peripheral edge of the conductive plate 112 in a transverse direction with respect to said conductive plate 112. In particular, the first conductor 110 comprises a first connecting portion 113 that extends from the conductive plate 112 away from the capacitive element 105. The first connecting portion 113 is for example configured to abut terminals of a power electronic module, notably in an electrical apparatus 200 (described below). The first electrical conductor 110 may comprise a second connecting portion 114 that extends from the conductive plate 112 facing the capacitive element 105. The second portion 114 is for example configured to abut an electrical conductor in order to connect the capacitive block to an electrical power supply.

In order to protect the connecting portions 113, 114, the frame 101 may comprise protective portions 103, 104 that extend along the connecting portions 113, 114 so as to electrically protect them from the environment of the capacitive block 100. In particular, the frame 101 comprises a first protective portion 103 that extends from the first portion 101a of the frame 101 in a direction opposite to that of the skirt formed by the second portion 101b of the frame 101. The first protective portion 103 extends facing a face of the first connecting portion 113 in order to cover it at least partially. In particular, the first protective portion 103 and the first connecting portion 103 are superposed in a direction perpendicular to said face of the first connecting portion 113. The frame 101 comprises a second protective portion 104 formed by the skirt 101b. The protective portions 103, 104 notably make it possible to electrically insulate the connecting portions 113, 114 from the nearby element 200, notably preventing an electric arc from forming through the air or a current from flowing along a leakage path.

Figure 6:
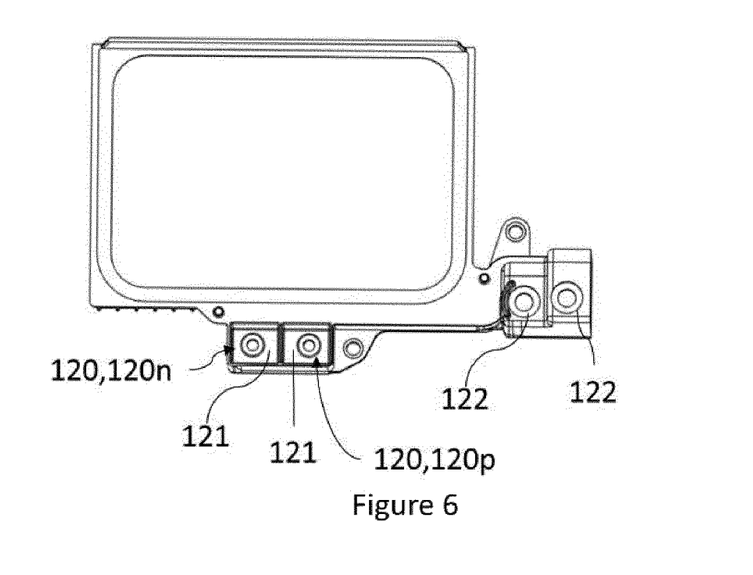
FIG. 6 shows a plan view of the frame.

Making reference to FIG. 6, the frame 101 may comprise at least one second electrical conductor 120 configured to go over the first electrical conductor 110 so as to connect the first electrical conductor 110 to an electrical component other than the capacitive element 105, such as a filtering element for filtering an electrical power supply.

In particular, the capacitive block 100 comprises a positive first conductor 110p and a negative first conductor 110n. The first conductors 110p, 110n are notably coplanar on a face of the capacitive block 100 where the first ends 105a of the capacitive elements 105 are found. The frame 101 comprises a positive second electrical conductor 120p and a negative second electrical conductor 120n that are connected to the positive first conductor 110p and to the negative first conductor 110n, respectively. The second electrical conductors 120 are therefore integrated into the frame 101. The second electrical conductors 120 are for example supported by the material of the frame 101 using clips, or by force-fitting, or by overmolding.

The first frame 101 therefore further serves to connect the first conductor 110 to an electrical component other than the capacitive element 105, such as a filtering element for filtering an electrical power supply. In particular, one end 115 of the second connecting portion 114 is configured to go over one end 121 of the second electrical conductor 120 of the frame 101 in order to make an electrical connection. Notably, the connecting region between the ends 115, 121 is surrounded by a wall 106 that is integral with the insulating material of the frame 101, notably in order to provide electrical protection.

Figure 5:
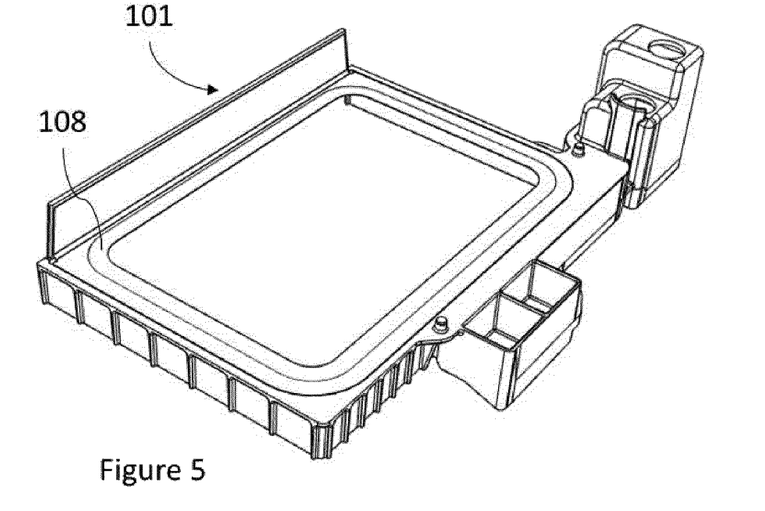
FIG. 5 illustrates one variant in which there is an additional insulating film on the frame.

In a variant illustrated in FIG. 5, an additional electrically insulating film 108 in the form of a frame runs continuously all along the inner edge of the frame 101, extending radially toward the inside of the frame 101, that is to say into the central opening of the frame 101. The insulating film 108 notably makes it possible to enlarge the leakage path that passes along the first portion 101a of the frame 101, and that runs from the conductive plate 112 to an element in the vicinity of the capacitive block 100, notably the cooling circuit 220 that is located facing the conductive plate and will be described below. For example, the insulating film 108 is made of polyester (PET) and/or is 200 microns thick, or between 180 and 220 microns thick.

FIG. 7 illustrates an example of an electrical apparatus 200 comprising the capacitive block 100. The electrical apparatus 200 further comprises a power electronic module 210 and a cooling circuit 220. The conductive plate 112 of the capacitive block 100 abuts one face of the cooling circuit 220 and the power electronic module 210 abuts an opposite face of the cooling circuit 220. The cooling circuit notably comprises a channel 221 located between the power electronic module 210 and the capacitive block 100, through which a cooling liquid flows. In particular, the components 105, 200, 220 are housed in a casing 225, only part of which may be seen in FIG. 7.

In particular, the first connecting portion 113 of the first conductor 110 is connected directly to the electrical terminals 211 of the power electronic module 210. To this end, the first connecting portion 113 spans a passage formed by an edge of the cooling circuit 220 and a wall of the casing 225. The first protective portion 103 of the frame 101 also extends in this passage between the first connecting portion 113 and the cooling circuit 220. Thus, the first protective portion 103 electrically insulates the first connecting portion 103 from the cooling circuit 220. The first connecting portion notably prevents an electric arc from forming in the air between the first connecting portion 113 and the cooling circuit 220.

Figure 8:
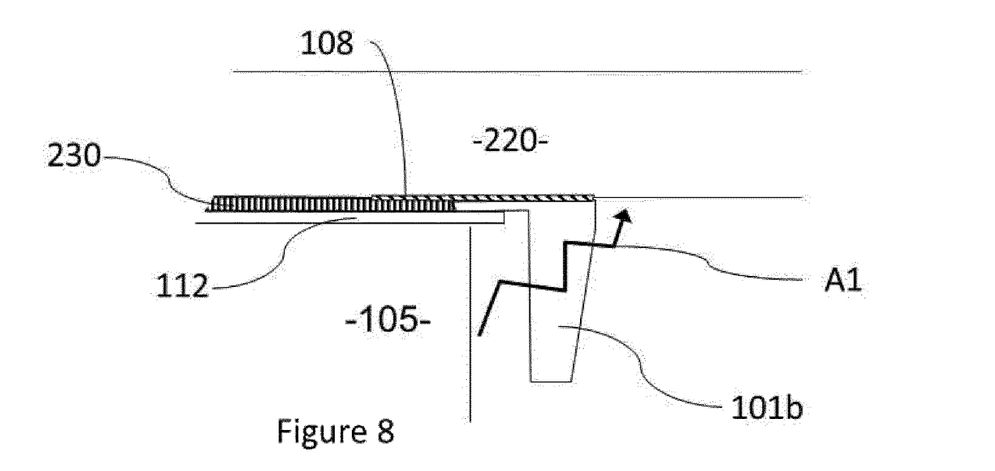
FIG. 8 depicts an example of an electric arc that is prevented in the electrical apparatus of FIG. 7.
Figure 9:
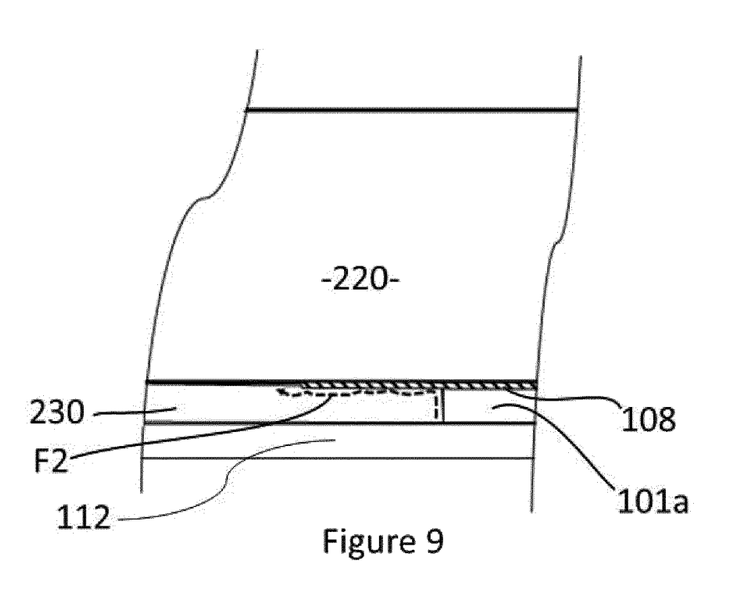
FIG. 9 depicts an example of a leakage path that is prevented in the electrical apparatus of FIG. 7.

The electrical apparatus 200 notably comprises a layer 230 of electrically insulating but thermally conductive material, which may be seen more clearly in FIGS. 8 and 9. This layer 230 is located between the cooling circuit 220 and the conductive plate 112. In particular, the layer 230 is a Gap Pad®. The layer 230 of material is notably adjusted to the central opening of the frame 101, in order to improve the contact between the material 230 and the conductive plate 112, and thus improve heat dissipation between the conductive plate 112 and the cooling circuit 220.

The first part 101a of the frame 101 further has the function of limiting the compression of the layer of material 230. For example, this first part 101a prevents the layer of material 230 from compressing by more than 30% of the initial thickness of the layer 230. In particular, the thickness of the first part 101a of the frame 101 is configured to prevent the layer 230 from compressing in this way. The first part 101a of the frame 101 is for example 0.8 mm thick.

As illustrated schematically in FIG. 8, the frame 101, in particular the skirt 101b, improves the electrical insulation of the conductive plate 112 from the cooling circuit 220, preventing an electric arc A1 from forming through the air between the conductive plate 112 and the cooling circuit 220.

As illustrated schematically in FIG. 9, the insulating film 108 improves the electrical insulation by enlarging the leakage path F2 between the conductive plate 112 and the cooling circuit 220. Such a leakage path F2 starts from the conductive plate 112, follows the boundary between the layer of material 230 and the first part 101a of the frame 101, then the boundary between the layer of material 230 and the insulating film 108, as far as the cooling circuit 220. It is more advantageous to add the insulating film 108 than to enlarge the overlap between the first portion 101a of the frame 101 since the insulating film 108 allows better heat dissipation than the frame 101.

According to one embodiment, making reference to FIGS. 1 and 3, a housing 150 may house the second end 105b of the capacitive element 100 in order to receive a filler material in order to seal the second end 150b. The filler material is notably an electrically insulating material, such as a resin. In particular, the first end 105a is located outside said housing 150. Prior to the housing 150 being filled with the filler material, notably with the liquid-phase resin, the capacitive element 105 is positioned in said housing 150. A spacer 151 that extends from a bottom of said housing 150 then abuts the conductive plate 112 which forms a stop. The spacer 151 then determines the distance between the first end 105a of the capacitive element 105 and the bottom of said housing 105.

The invention claimed is:

1. A capacitive block comprising:
   at least one capacitive element;
   a first electrical conductor comprising at least one electrically conductive plate abutting a first end of the at least one capacitive element so as to be electrically connected to the at least one capacitive element; and
   a first frame made of electrically insulating material coming into register with a peripheral edge of said at least one electrically conductive plate so as to electrically insulate said at least one electrically conductive plate from an environment of the capacitive block,
   wherein said first frame comprises a first portion configured to abut a face of the at least one electrically conductive plate and a second portion extending transversely from said first portion so as to form a skirt around said at least one electrically conductive plate,
   wherein said first electrical conductor includes at least one connecting portion extending from a peripheral edge of said at least one electrically conductive plate in a transverse direction with respect to said at least one electrically conductive plate, and
   wherein said first frame comprises a protective portion extending facing a face of said at least one connecting portion so as to protect it electrically from an environment of the capacitive block.

2. The capacitive block as claimed in claim 1, wherein the skirt extends over a distance from the first portion of the first frame so as to prevent a current from flowing through the air between the at least one electrically conductive plate and the environment of the capacitive block.

3. The capacitive block as claimed in claim 1, wherein the first electrical conductor comprises a first connecting portion that extends away from the at least one capacitive element, and said first frame comprises a first protective portion that extends from the first portion of the first frame in a direction opposite to that of the skirt formed by the second portion of the first frame.

4. The capacitive block as claimed in claim 1, wherein the first electrical conductor comprises a second connecting portion that extends from the at least one electrically conductive plate facing the at least one capacitive element, and said first frame comprises a second protective portion formed by at least part of the skirt.

5. The capacitive block as claimed in claim 1, wherein said first frame supports at least one second electrical conductor configured to go over the first electrical connector so as to connect the first electrical conductor to an electrical component other than the at least one capacitive element to a filtering element for filtering an electrical power supply.

6. The capacitive block as claimed in claim 1, further comprising: an electrically insulating film in the form of a frame, running continuously all along the inner edge of the first frame and extending radially toward the inside of the first frame.

7. The capacitive block as claimed in claim 1, wherein the at least one electrically conductive plate abuts at least one electrode of the at least one capacitive element, said at least one electrode being located at said first end of the at least one capacitive element, in order to be electrically connected thereto.

8. An electrical apparatus configured to be installed in a vehicle, comprising:
   the capacitive block as claimed in claim 1;
   a power electronic module; and
   a cooling circuit;
   the at least one electrically conductive plate of the capacitive block abutting one face of the cooling circuit, the power electronic module abutting an opposite face of the cooling circuit.

9. The electrical apparatus as claimed in claim 8, wherein the first electrical conductor comprises a first connecting portion that extends away from the at least one capacitive element, and said first frame comprises a first protective portion that extends from the first portion of the first frame in a direction opposite to that of the skirt formed by the second portion of the first frame,
   wherein the first connecting portion is connected directly to electrical terminals of the power electronic module, passing through a passage formed at least in part by an edge of the cooling circuit, and wherein the first protective portion of said first frame extends in said passage between said first connecting portion and said cooling circuit.

10. The electrical apparatus as claimed in claim 8, further comprising a layer of electrically insulating but thermally conductive material between the cooling circuit and the at least one electrically conductive plate, said layer of material going into the central opening of the first frame.

* * * * *